US009396787B2

(12) United States Patent
Shoemaker et al.

(10) Patent No.: US 9,396,787 B2
(45) Date of Patent: Jul. 19, 2016

(54) MEMORY OPERATIONS USING SYSTEM THERMAL SENSOR DATA

(75) Inventors: Kenneth Shoemaker, Los Altos Hills, CA (US); Paul Fahey, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,975

(22) PCT Filed: Dec. 23, 2011

(86) PCT No.: PCT/US2011/067284
§ 371 (c)(1),
(2), (4) Date: Jun. 25, 2013

(87) PCT Pub. No.: WO2013/095674
PCT Pub. Date: Jun. 27, 2013

(65) Prior Publication Data
US 2014/0140156 A1    May 22, 2014

(51) Int. Cl.
*G11C 7/04* (2006.01)
*G11C 11/406* (2006.01)
(Continued)

(52) U.S. Cl.
CPC .......... *G11C 11/40626* (2013.01); *G06F 1/206* (2013.01); *G11C 5/025* (2013.01); *G11C 7/04* (2013.01); *G11C 11/406* (2013.01); *G11C 11/40615* (2013.01); *G11C 2211/4067* (2013.01)

(58) Field of Classification Search
CPC .. G11C 7/04; G11C 11/40626; G11C 11/406; G11C 11/40615; G06F 1/206; G06F 2217/80; G01K 1/00
USPC .................................. 365/211, 222, 201, 61
See application file for complete search history.

(56) References Cited

U.S. PATENT DOCUMENTS 5,502,838 A    3/1996 Kikinis
5,902,044 A    5/1999 Pricer et al.
(Continued)

FOREIGN PATENT DOCUMENTS

CN    1751357    3/2006
CN    1828549    9/2006
(Continued)

OTHER PUBLICATIONS

International Search Report and Written Opinion of the International Searching Authority dated Sep. 17, 2012, in International Patent Application No. PCT/US2011/067284, 9 pages.
(Continued)

*Primary Examiner* — David Lam
(74) *Attorney, Agent, or Firm* — Blakely, Sokoloff, Taylor & Zafman LLP

(57) ABSTRACT

Memory operations using system thermal sensor data. An embodiment of a memory device includes a memory stack including one or more coupled memory elements, and a logic chip coupled with the memory stack, the logic chip including a memory controller and one or more thermal sensors, where the one or more thermal sensors include a first thermal sensor located in a first area of the logic chip. The memory controller obtains thermal values of the one or more thermal sensors, where the logic element is to estimate thermal conditions for the memory stack using the thermal values, the determination of the estimated thermal conditions for the memory stack being based at least in part on a location of the first thermal sensor in the first area of the logic element. A refresh rate for one or more portions of the memory stack is modified based at least in part on the estimated thermal conditions for the memory stack.

28 Claims, 9 Drawing Sheets

(51) Int. Cl.
*G06F 1/20* (2006.01)
*G11C 5/02* (2006.01)

(56) References Cited

U.S. PATENT DOCUMENTS

| | | |
|---|---|---|
| 6,488,405 B1 | 12/2002 | Eppes et al. |
| 6,557,072 B2 | 4/2003 | Osborn |
| 6,662,136 B2 | 12/2003 | Lamb et al. |
| 6,908,227 B2 | 6/2005 | Rusu et al. |
| 7,260,007 B2 | 8/2007 | Jain et al. |
| 7,535,020 B2 | 5/2009 | Yoshida et al. |
| 7,549,795 B2 | 6/2009 | Kosta et al. |
| 7,590,020 B2 | 9/2009 | Lee |
| 7,590,473 B2 | 9/2009 | Wyatt |
| 7,621,671 B2 | 11/2009 | Petruzzi et al. |
| 7,775,710 B2 | 8/2010 | Mukherjee |
| 7,965,571 B2 * | 6/2011 | Jeong et al. .................. 365/222 |
| 7,984,250 B2 | 7/2011 | Steinbrecher et al. |
| 8,096,705 B2 | 1/2012 | Sri-Jayantha et al. |
| 8,174,921 B2 | 5/2012 | Kim et al. |
| 8,186,878 B2 | 5/2012 | Janzen et al. |
| 8,192,082 B2 | 6/2012 | Song et al. |
| 8,425,115 B2 | 4/2013 | Rahman et al. |
| 8,590,332 B2 | 11/2013 | Wyatt |
| 8,624,527 B1 | 1/2014 | Meir et al. |
| 8,762,097 B2 | 6/2014 | Millet |
| 8,892,269 B2 | 11/2014 | Shrall et al. |
| 9,104,540 B2 | 8/2015 | Toronyi |
| 9,182,800 B2 | 11/2015 | Trautman et al. |
| 2001/0021217 A1 | 9/2001 | Gunther et al. |
| 2003/0158683 A1 | 8/2003 | Gauthier et al. |
| 2004/0204899 A1 | 10/2004 | Gunther et al. |
| 2005/0146965 A1 | 7/2005 | Kim et al. |
| 2005/0201174 A1 | 9/2005 | Klein |
| 2006/0004537 A1 | 1/2006 | Jain et al. |
| 2006/0007722 A1 | 1/2006 | Nordal et al. |
| 2006/0221741 A1 | 10/2006 | Jain et al. |
| 2006/0242447 A1 | 10/2006 | Radhakrishnan et al. |
| 2007/0045825 A1 | 3/2007 | Chan et al. |
| 2007/0140315 A1 | 6/2007 | Janzen et al. |
| 2007/0145578 A1 | 6/2007 | Lee |
| 2007/0191993 A1 | 8/2007 | Wyatt |
| 2007/0271409 A1 | 11/2007 | Miura et al. |
| 2008/0007319 A1 | 1/2008 | Cox |
| 2008/0043556 A1 | 2/2008 | Nale |
| 2008/0218192 A1 | 9/2008 | Johnson |
| 2008/0239852 A1 | 10/2008 | Jazayeri |
| 2009/0141576 A1 | 6/2009 | Ruckerbauer |
| 2009/0168840 A1 | 7/2009 | Song et al. |
| 2010/0131724 A1 | 5/2010 | Miura et al. |
| 2010/0142291 A1 | 6/2010 | Joo et al. |
| 2010/0169585 A1 | 7/2010 | Steinbrecher et al. |
| 2010/0214814 A1 | 8/2010 | Park et al. |
| 2011/0054717 A1 | 3/2011 | Yamauchi et al. |
| 2011/0093132 A1 | 4/2011 | Tan et al. |
| 2011/0193086 A1 | 8/2011 | Lee et al. |
| 2011/0194369 A1 | 8/2011 | Jeddeloh |
| 2012/0163413 A1 | 6/2012 | Kim et al. |
| 2012/0297241 A1 | 11/2012 | Jeddeloh |
| 2013/0003781 A1 | 1/2013 | Pan |
| 2013/0279276 A1 | 10/2013 | Schaefer |
| 2013/0294184 A1 | 11/2013 | Yang et al. |
| 2014/0092939 A1 | 4/2014 | Chang et al. |
| 2014/0122952 A1 | 5/2014 | Zimmerman |
| 2014/0140156 A1 | 5/2014 | Shoemaker et al. |
| 2014/0192583 A1 | 7/2014 | Rajan et al. |
| 2014/0237307 A1 | 8/2014 | Kobla et al. |
| 2014/0371945 A1 | 12/2014 | Sato |

FOREIGN PATENT DOCUMENTS

| | | |
|---|---|---|
| CN | 1993765 | 7/2007 |
| CN | 101133459 | 2/2008 |
| JP | 2006108256 | 4/2006 |
| JP | 2008048384 | 2/2008 |
| KR | 20080091941 | 10/2008 |
| WO | WO-2009081225 | 7/2009 |

OTHER PUBLICATIONS

Office Action dated Mar. 12, 2015 (+ English translation), in Taiwan Patent Application No. 101147195, 15 pages.
Final Office Action for U.S. Appl. No. 13/336,806, mailed Jan. 9, 2014, 7 pages.
Office Action for U.S. Appl. No. 13/336,806, mailed Jun. 28, 2013, 8 pages.
Office Action & Search Report for Taiwan Patent Application No. 101104389 mailed Jun. 12, 2014, 16 pages.
International Search Report and Written Opinion for PCT/US2012/024340 mailed Sep. 7, 2012, 9 pages.
International Preliminary Report on Patentability for PCT/US2012/024340 mailed Oct. 10, 2013, 6 pages.
Office Action for U.S. Appl. No. 13/336,806, mailed Jul. 28, 2014, 7 pages.
Notice of Preliminary Rejection for Korean Patent Application No. 10-2013-7025329 mailed Jul. 10, 2014, 10 pages.
Non-Final Office Action for U.S. Appl. No. 13/077,661 mailed Sep. 8, 2014, 19 pages.
Non-Final Office Action for U.S. Appl. No. 13/077,661 mailed Jun. 10, 2013, 16 pages.
Final Office Action for U.S. Appl. No. 13/077,661 mailed Jan. 17, 2014, 14 pages.
Extended European Search Report for European Patent Application No. 12763926.8 mailed Nov. 10, 2014, 8 pages.
Final Office Action for U.S. Appl. No. 13/077,661 mailed Dec. 29, 2014, 7 pages.
Ex Parte Quayle Action for U.S. Appl. No. 13/336,806, mailed Jan. 5, 2015, 4 pages.
Office Action & Search Report for Taiwan Patent Application No. 101104389 mailed Dec. 8, 2014, 21 pages.
Notice of Last Preliminary Rejection for Korean Patent Application No. 10-2013-7025329 mailed Jan. 27, 2015, 10 pages.
Notice of Allowance for U.S. Appl. No. 13/336,806, mailed Apr. 2, 2015, 6 pages.
First Office Action dated Aug. 4, 2015 (+ English summary), in Chinese Patent Application No. 201280016742.2, 15 pages.
Notice of Final Rejection dated Jul. 30, 2015 (+ English translation), in Korean Patent Application No. 10-2013-7025329, 3 pages.
Office Action mailed Aug. 27, 2015, in U.S. Appl. No. 13/077,661, 8 pages.
Second Office Action dated Aug. 18, 2015 (+ English translation), in Taiwanese Patent Application No. 101104389, 2 pages.
Notice of Allowance and Fees for U.S. Appl. No. 13/336,806 mailed Sep. 23, 2015, 7 pgs.
Extended European Search Report completed Jan. 21, 2016, in European Patent Application No. 15 18 7070, 9 pages.
Allowance Decision for Taiwanese Application No. 101104389 mailed on Feb. 16, 2016, 2 pages.
Notice of Allowance for U.S. Appl. No. 13/077,661, mailed on Feb. 29, 2016, 13 pages.
First Office Action and Search Report received (+ English Translation) for Taiwanese Application No. 104137715, mailed on Apr. 7, 2016, 6 pages.
English Translation of Non-Final Preliminary Rejection mailed Jan. 28, 2016, in Korean Patent Application No. 10-2015-7031435, 9 pages.
Notice of Publication mailed on Feb. 17, 2016, European Application No. 15187070.6-1959/2996014, 2 pages.
Second European Office Action mailed on Jan. 27, 2016, European Application No. 12763926.8, 6 pages.
First Office Action, Chinese Application No. 201180076442.9 mailed on Mar. 1, 2016, 40 pages.

* cited by examiner

US 9,396,787 B2

MEMORY OPERATIONS USING SYSTEM THERMAL SENSOR DATA

CROSS-REFERENCE TO RELATED APPLICATION

This application is a national phase of PCT/US2011/067284 filed Dec. 23, 2011, which application is incorporated herein by reference in its entirety.

TECHNICAL FIELD

Embodiments of the invention generally relate to the field of electronic devices and, more particularly, to memory operations using system thermal sensor data.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

As 3D stacked memory devices are increased in size, there are varying temperatures through the memory stack. The inner part of a 3D memory stack will generally be hotter than the outer portions since only the outer portions are exposed to cooling, and a larger stack will generally result in a higher temperature difference between the inner and outer portions.

The operation of a memory changes as the memory is heated. In particular, a memory generally requires more frequent refresh cycles at higher temperatures.

However, lower cost memory may not include thermal sensors, or may not provide thermal data. Without thermal sensing, it is difficult to determine how heat is spread throughout a memory device, and thus how to appropriately handle refresh operations.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
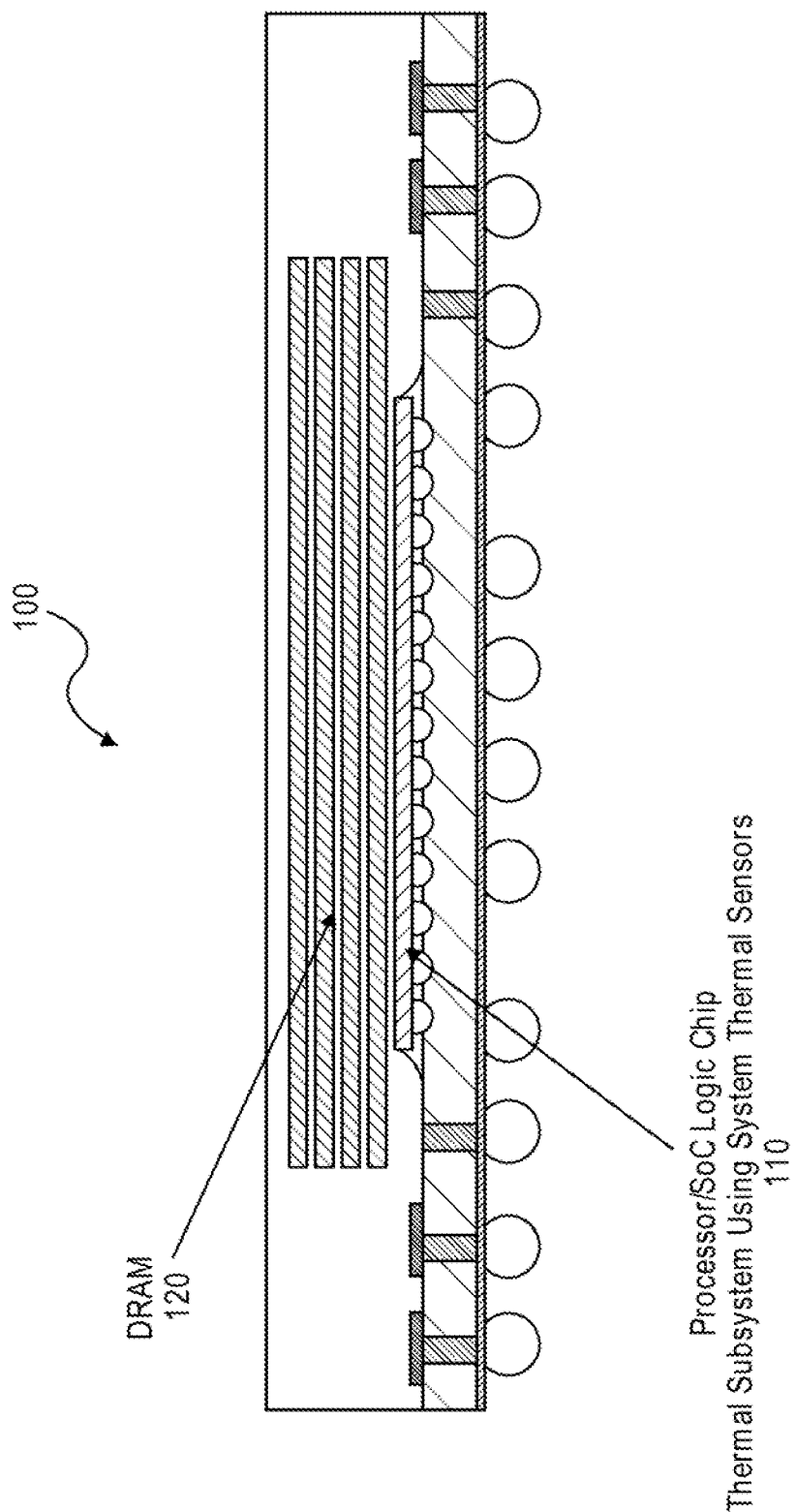
FIG. 1 illustrates an embodiment of a stacked memory device.

Embodiments of the invention are generally directed to dynamic operations for 3D stacked memory using thermal data.

As used herein:

"3D stacked memory" (where 3D indicates three-dimensional) or "stacked memory" means a computer memory including one or more coupled memory layers, memory packages, or other memory elements. The memory may be vertically stacked or horizontally (such as side by side) stacked, or otherwise contain memory elements that are coupled together. The memory may include, for example, the implementations illustrated in FIG. 8A and FIG. 8B. In particular, a stacked memory DRAM device or system may include a memory device having a plurality of DRAM layers. A stacked memory device may also include system elements in the device, where the system elements may include a logic chip. The logic chip may include a system on chip (SoC), and may include elements such as a CPU (central processing unit), a memory controller, and other related system elements. In some embodiments, the logic chip may be an application processor or graphics processing unit (GPU).

A DRAM will operate differently at different temperatures. In particular, DRAM chips exhibit variable retention times based on temperature, thus affecting a required refresh frequency of the DRAM. Low-power DRAM chips may use this property in a feature referred to as "temperature compensated self refresh." This feature may be used to reduce the refresh frequency to required levels rather than refreshing the memory to meet, for example, worst case scenarios for the memory. The feature may thereby be used to reduce standby power consumption of a memory.

A stacked memory device may include areas that become much warmer than other areas. A determination of these thermal gradients within the memory stack could be used to define memory refresh requirements.

However, certain memory elements, including memory elements that are manufactured at a lower cost, may not include thermal sensors within the memory, or, if thermal sensors are present, such sensors may not be accessible to a memory controller or other processing element for use in managing the operation of a stacked memory device. For example, thermal sensors in DRAM devices may not be exposed outside of the DRAM except to indicate very high temperature excursions. DRAM vendors may not typically wish to expose lower temperature indications as vendors do not want to guarantee the accuracy of their temperature sensors.

In some embodiments, thermal sensors provided in a logic chip, including a system on chip, are used to provide thermal information to a DRAM controller or other processing elements, where the information is used by the memory controller or memory elements to reduce auto-refresh frequency to more efficient levels and thereby improve performance and reduce active power consumption. In some embodiments, the logic chip is closely bound with the DRAM memory elements, such that the thermal information obtained from the thermal sensors may be used to deduce a thermal state of the memory elements.

In some embodiments, memory power and performance optimization functions are provided in a stacked chip device, where the memory die layers and the logic chip (such as a processor or SoC logic chip) are on separate chips, but are very closely coupled. When a logic chip and a stacked memory of DRAM die layers are stacked to the manufacture a stacked memory device, such as with a Wide IO memory interconnector PoP packages, there is little thermal gradient between the memory stack and the logic chip. In some embodiments, thermal sensors present in a logic chip may be used to estimate thermal conditions in the memory die layers.

In some embodiments, the estimated thermal conditions may be used to determining performance settings for the memory, including refresh cycle frequencies for portions of the memory stack. A logic chip may contain multiple thermal sensors that are used to monitor the temperature on various parts of the logic chip. In some embodiments, because of thermal coupling between the memory stack and the logic chip, the thermal sensors of the logic chip may also be used to estimate temperatures of the DRAM chips. In some embodiments, a logic chip's thermal sensors provide thermal information to the DRAM controller, where the controller may use this information to reduce auto-refresh frequency thereby improving performance and reducing active power. In some embodiments, an apparatus or system may also use the thermal information to ensure sufficient refresh as temperature increases, and thus allow for operation of a stacked memory device at higher temperatures.

In some embodiments, a memory device includes a memory stack including one or more coupled memory elements, and a logic element, the logic element including one or more thermal sensors, where the one or more thermal sensors including a first thermal sensor in a first area of the logic element. In some embodiments, the logic element determines thermal values of the one or more thermal sensors, wherein the logic element is to estimate thermal conditions for the memory stack using the thermal sensor values. In some embodiments, the determination of the estimated thermal conditions for the memory stack is based at least in part on the location of each of the one or more thermal sensors including the location of the first thermal sensor in the first area of the logic element, and a refresh rate for one or more portions of the memory stack is modified based at least in part on the estimated thermal conditions for the memory stack.

In some embodiments, a method includes collecting temperature data from one or more thermal sensors in a logic chip, the logic chip being coupled with a memory stack; estimating thermal conditions of the memory stack based on the collected temperature data and a location of each of the one or more thermal sensors; determining a recommended refresh rate for each of one or more portions of the memory stack; and upon determining that a refresh rate of a portion of the memory stack is different than a recommended refresh rate, adjusting the refresh rate for the portion of the memory stack.

FIG. 1 is an illustration of embodiment of a stacked memory device. In some embodiments, a stacked memory device 100 includes a memory stack including one more DRAM die layers 120 that is closely coupled with a logic chip 110, which may be an SoC or other system element. In some embodiments, the logic chip 110 may include a thermal subsystem for the memory stack 120, the thermal subsystem including one or more thermal sensors that may be utilized to estimate thermal conditions in the memory stack 120.

In some embodiments, the logic chip 110 or the DRAM die layers may use the estimated thermal conditions of the memory stack 120 to determine needed refresh rates for portions of the memory stack 120. In some embodiments, the logic chip or DRAM die layers may use the estimated thermal conditions to avoid performing refresh operations more frequently than necessary, and the logic thus may operate to reduce power consumption of the memory device 100. In some embodiments, an apparatus or system may also use the estimated thermal conditions to ensure sufficient refresh rates as temperature increases, and thus allow for operation of the stacked memory device 100 at higher temperatures.

Figure 2:
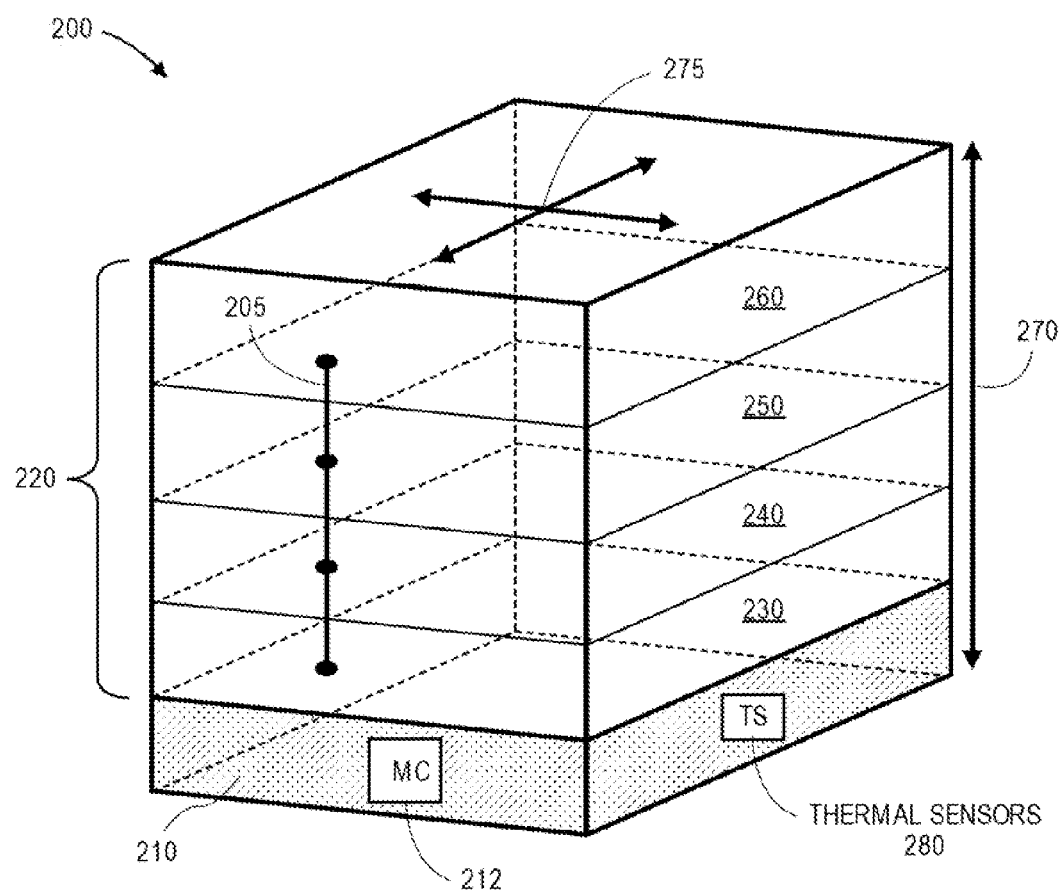
FIG. 2 illustrates an embodiment of a 3D stacked memory.

FIG. 2 illustrates an embodiment of a 3D stacked memory. In this illustration, a 3D stacked memory device 200, such as a WideIO memory device, includes a logic chip system element 210 coupled with one or more DRAM memory die layers 220, also referred to herein as the memory stack. In some embodiments, the logic chip 210 may be a system on chip (SoC) or other similar element. The elements of this figure and the following figures are presented for illustration, and are not drawn to scale. Each die layer may include one or more slices or portions, and may have one or more different channels. Each die layer may include a temperature compensated self-refresh (TCSR) circuit to address thermal issues, where the TCSR and a mode register (MR) may be a part of management logic of the device, and where the MC may include thermal offset bit(s) for adjustment of refresh rate by the TCSR. The die layers and the system element may be thermally coupled together.

While FIG. 2 illustrates an implementation in which the logic chip 210 is coupled below the memory stack of one or more memory die layers 220, embodiments are not limited to this arrangement. For example, in some embodiments a system element 210 may be located adjacent to the memory stack 220, and thus may be coupled in a side-by-side arrangement with the memory stack 220.

In this illustration, the DRAM memory die layers include four memory die layers, these layers being a first memory die layer 230, a second memory die layer 240, a third memory die layer 250, and a fourth memory die layer 260. However, embodiments are not limited to any particular number of memory die layers in the memory stack 210, and may include a greater or smaller number of memory die layers. Among other elements, the system element 210 may include a memory controller 212 for the memory stack 220. In some embodiments, each memory die layer (with the possible exception of the top, or outermost, memory die layer, such as the fourth memory die layer 260 in this illustration) includes a plurality of through silicon vias (TSVs) 205 to provide paths through the silicon substrate of the memory die layers.

The memory 200 may include one more temperature gradients, where temperature gradients may include vertical gradients 270, such as cooler areas nearer cooling fins or other cooling elements, and horizontal temperature gradients 275, such as differences between a hotter inner core and cooler outside portions of the memory stack 220.

In some embodiments, the logic chip 210 may include one or more thermal sensors 280 that may be used to estimate thermal conditions in the memory stack 220, where the memory controller 212 or the memory die layers 220 may use the estimated thermal conditions to determine refresh rates for portions of the memory stack 220. In some embodiments, the a memory die layer 220 may use the estimated thermal condition to tune temperature values generated by thermal sensors of the memory die layer.

Figure 3:
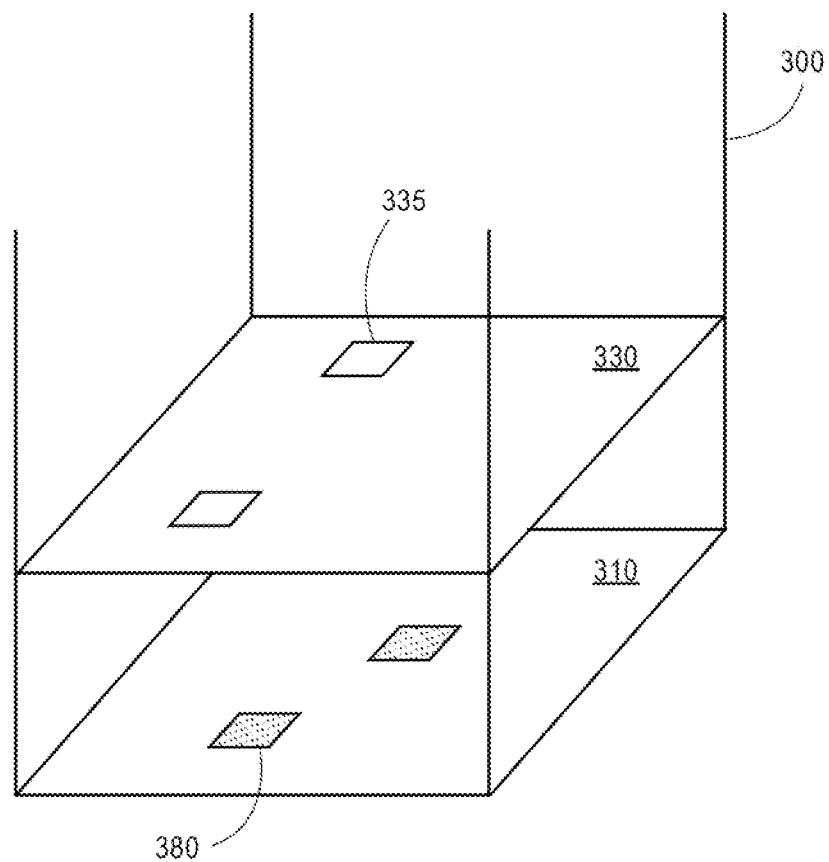
FIG. 3 is an illustration of thermal sensors in an embodiment of a memory device.

FIG. 3 is an illustration of thermal sensors in an embodiment of a memory device. In some embodiments, a memory device 300 may include one or more memory chips 330 closely coupled with a logic chip 310. In some embodiments, the memory chips may not include thermal sensors, or, if thermal sensors 335 are present, data from such thermal sensors is not generally available outside of the memory chip 330 unless extreme temperatures are present.

In some embodiments, the logic chip includes one or more thermal sensors 380, and the logic chip uses such sensors to estimate heat conditions in the memory chip 330. In some embodiments, the logic chip 310 is aware of the location of each of the thermal sensors 380, and such knowledge may used in estimating temperatures in different areas of the memory chip.

Figure 4:
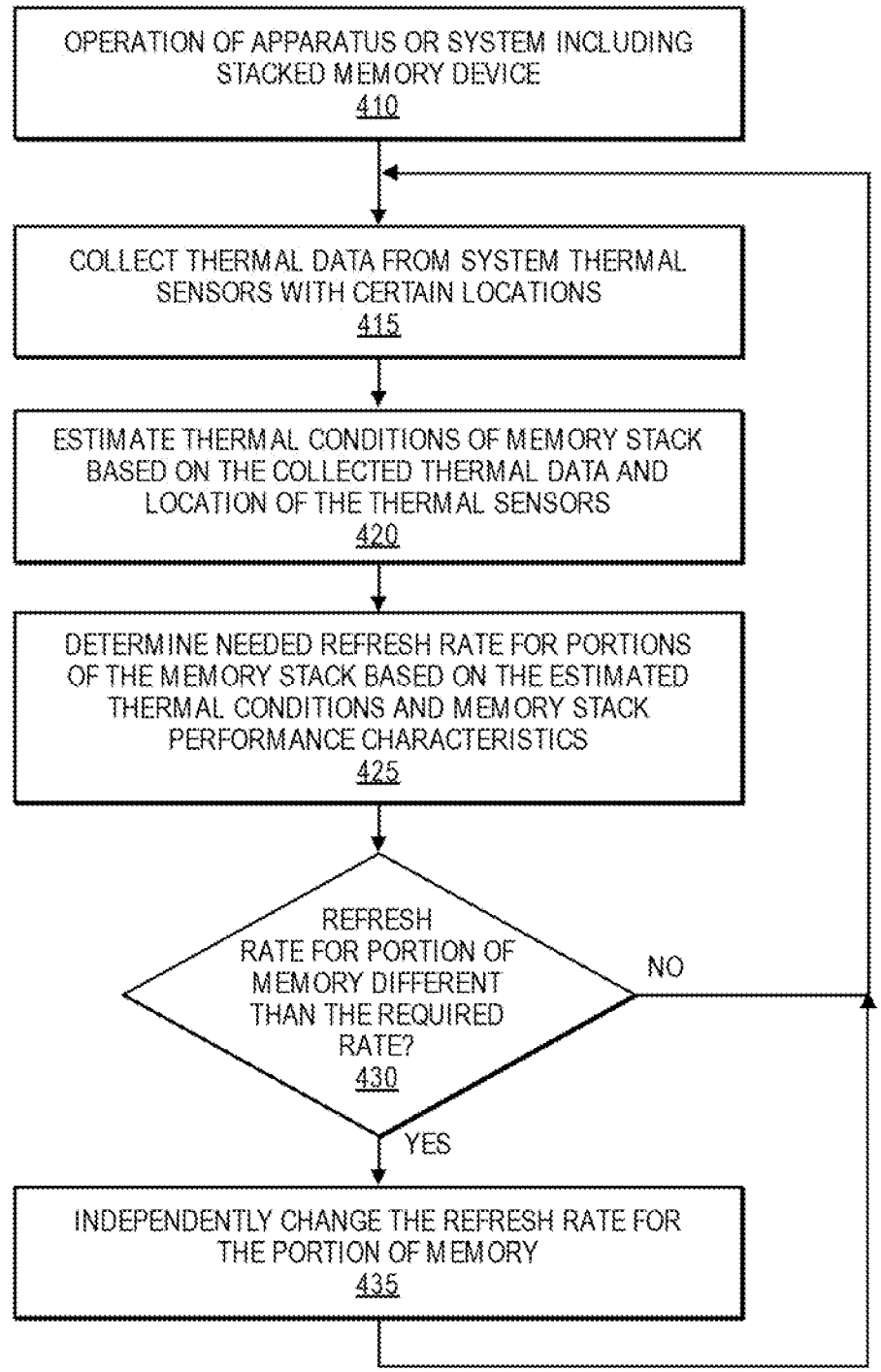
FIG. 4 is a flowchart to illustrate an embodiment of a method for establishing memory refresh using system thermal data.

FIG. 4 is a flowchart to illustrate an embodiment of a method for establishing memory refresh using system thermal data. In some embodiments, a apparatus or system including a stacked memory may be in operation 410. In some embodiments, the stacked memory may include a logic chip thermally coupled with a memory stack of one or more memory die layers. In some embodiments, a controller of the stacked memory may collect data from system thermal sensors in the logic chip 415.

In some embodiments, the controller may estimate thermal conditions of different areas of the memory stack based on the collected thermal data from the thermal sensors and the location of the thermal sensors 420. In some embodiments, the controller may determine a recommended refresh rate for each of multiple portions of the memory stack based on the estimated thermal conditions and memory stack performance characteristics 425, such as data regarding necessary refresh rates for memory elements at certain temperatures.

In some embodiments, if the estimated thermal condition data for the memory stack indicates that the refresh rate for any portion of the memory stack is different than the recommended refresh rate 430, the controller may independently change the refresh rate for the portion of the memory stack 435. The process then may continue with collection of thermal data from the system thermal sensors 410.

Figure 5:
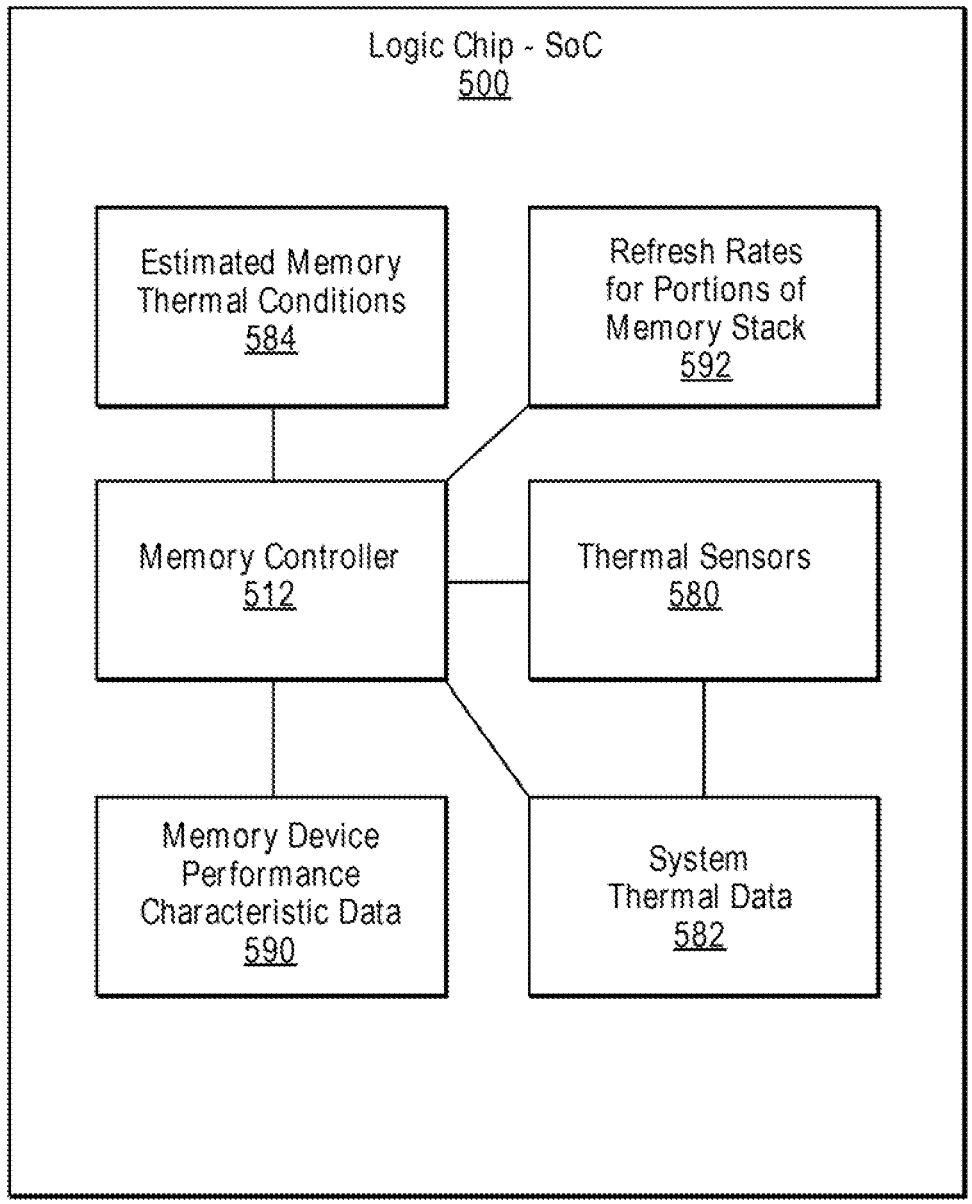
FIG. 5 illustrates an embodiment of a logic chip including a thermal subsystem for estimating memory thermal conditions.

FIG. 5 illustrates an embodiment of a logic chip including a thermal subsystem for estimating memory thermal conditions. In some embodiments, a logic chip 500 of a memory device (such as, for example, logic chip 210 of stacked memory 200 illustrated in FIG. 2) may include a memory controller 512 for control of memory of a memory stack, where the logic chip 500 is closely coupled with the memory stack such that temperatures in the logic chip are indicative of temperatures in the memory stack. In some embodiments, the logic chip includes one or more thermal sensors 580 to collect system thermal data 582.

In some embodiments, the logic chip may utilize the system thermal data 582 to generate estimated memory thermal conditions 584. In some embodiments, the estimated memory thermal conditions 584 and memory device performance characteristic data 590, including data describing necessary refresh rates for certain temperatures, may be used to establish refresh rates for one or more portions of the memory stack 592. In some embodiments, the memory controller 512 may adjust refresh rates for portions of the memory stack. In some embodiments, the memory controller may provide data regarding estimated thermal conditions to memory elements of the memory stack to allow the memory elements to adjust refresh rates for the memory elements.

Figure 6:
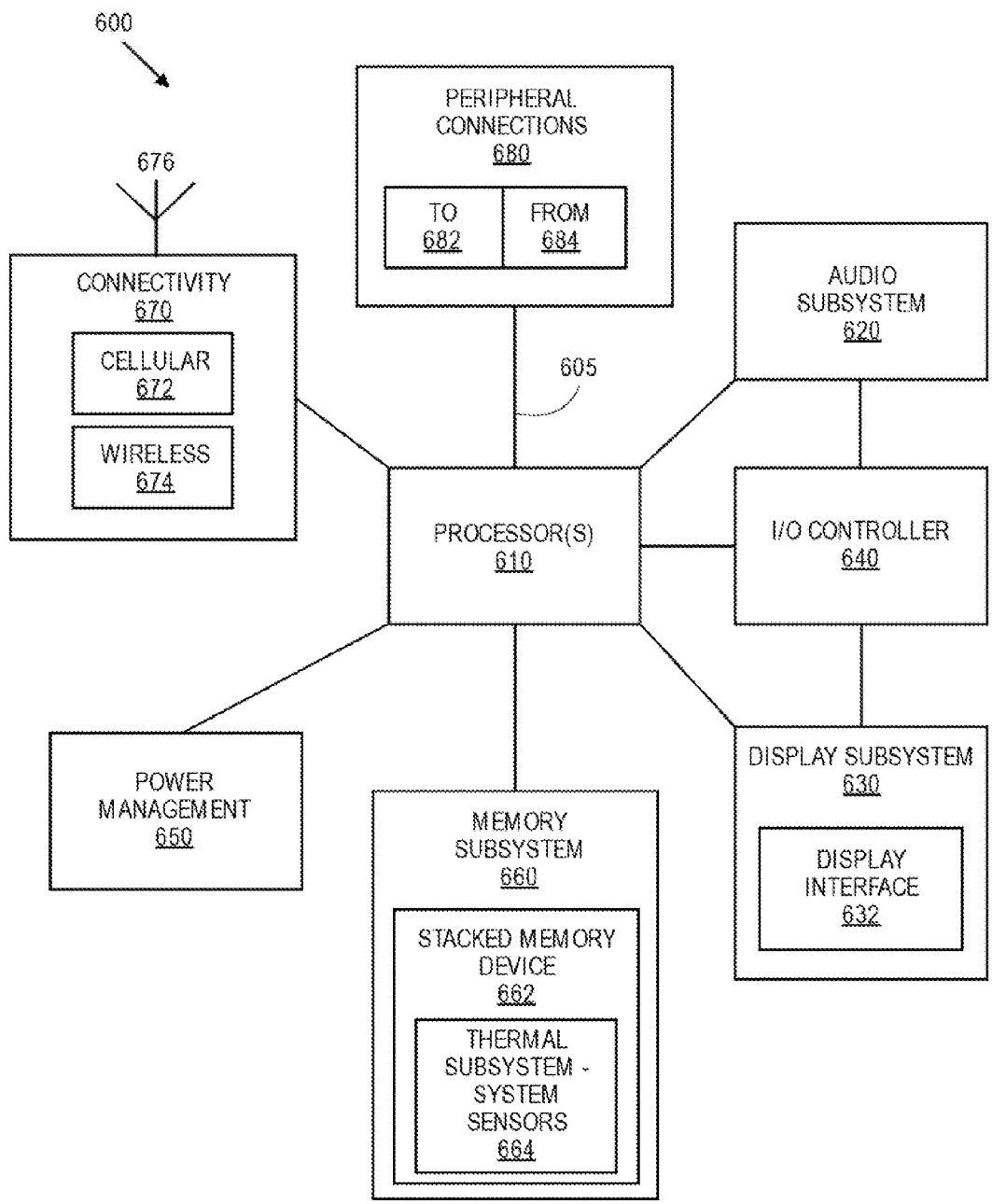
FIG. 6 is a block diagram to illustrate an embodiment of an apparatus or system including a stacked memory device.

FIG. 6 is a block diagram to illustrate an embodiment of an apparatus or system including a stacked memory device. Computing device 600 represents a computing device including a mobile computing device, such as a laptop or notebook computer, a netbook, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smartphone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the device. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the device to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as device data (whether long-term or temporary) related to the execution of the applications and functions of device 600.

In some embodiments, the memory subsystem 660 may include a stacked memory device 662 including a memory stack of one more memory die layers, where the stacked memory device includes a thermal subsystem 664 for estimation of thermal conditions in the stacked memory device using one or more system thermal sensors located in a logic chip that is closely coupled with the memory stack. In some embodiments, the information generated by the thermal subsystem may be used to establish efficient refresh rates for the memory stack, thereby reducing power consumption of the device.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 may commonly include a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
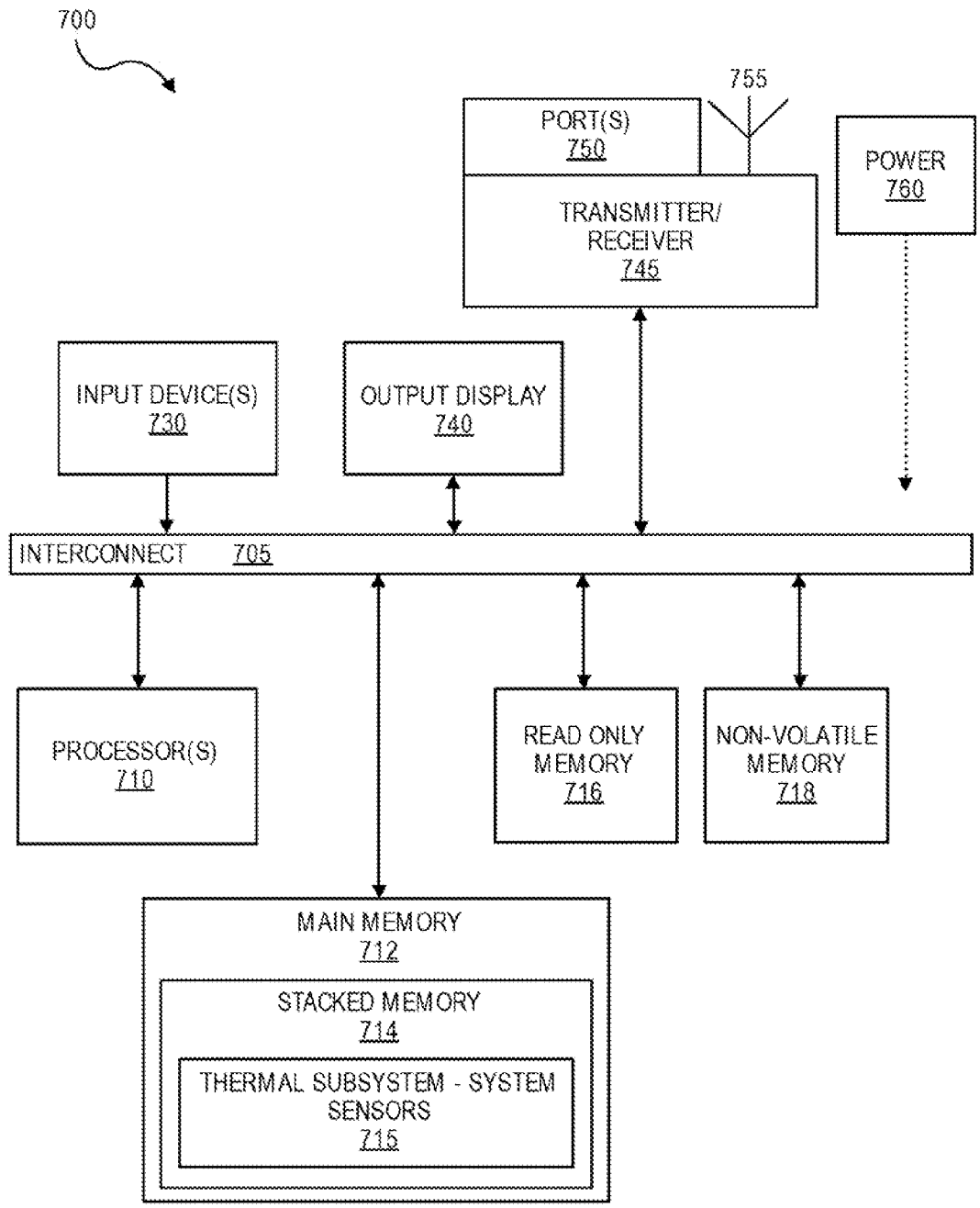
FIG. 7 illustrates an embodiment of a computing system including a thermal subsystem for estimating memory thermal conditions.

FIG. 7 illustrates an embodiment of a computing system including a thermal subsystem for estimating memory thermal conditions. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 712 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 712 includes stacked memory 714, wherein the stacked memory device includes a thermal subsystem 715 for estimation of thermal conditions in the stacked memory device using one or more system thermal sensors located in a logic chip that is closely coupled with the memory stack. In some embodiments, the information generated by the thermal subsystem may be used to establish efficient refresh rates for the memory stack, thereby reducing power consumption of the device.

The computing system 700 also may comprise a read only memory (ROM) 716 or other static storage device for storing static information and instructions for the processors 710. The computing system 700 may include one or more non-volatile memory elements 718 for the storage of certain elements.

In some embodiments, the computing system 700 includes one or more input devices 730, where the input devices include one or more of a keyboard, mouse, touch pad, voice command recognition, gesture recognition, or other device for providing an input to a computing system.

The computing system 700 may also be coupled via the interconnect 705 to an output display 740. In some embodiments, the display 740 may include a liquid crystal display (LCD) or any other display technology, for displaying information or content to a user. In some environments, the display 740 may include a touch-screen that is also utilized as at least a part of an input device. In some environments, the display 740 may be or may include an audio device, such as a speaker for providing audio information.

One or more transmitters or receivers 745 may also be coupled to the interconnect 705. In some embodiments, the computing system 700 may include one or more ports 750 for the reception or transmission of data. The computing system 700 may further include one or more omnidirectional or directional antennas 755 for the reception of data via radio signals.

The computing system 700 may also comprise a power device or system 760, which may comprise a power supply, a battery, a solar cell, a fuel cell, or other system or device for providing or generating power. The power provided by the power device or system 760 may be distributed as required to elements of the computing system 700.

Figure 8A:
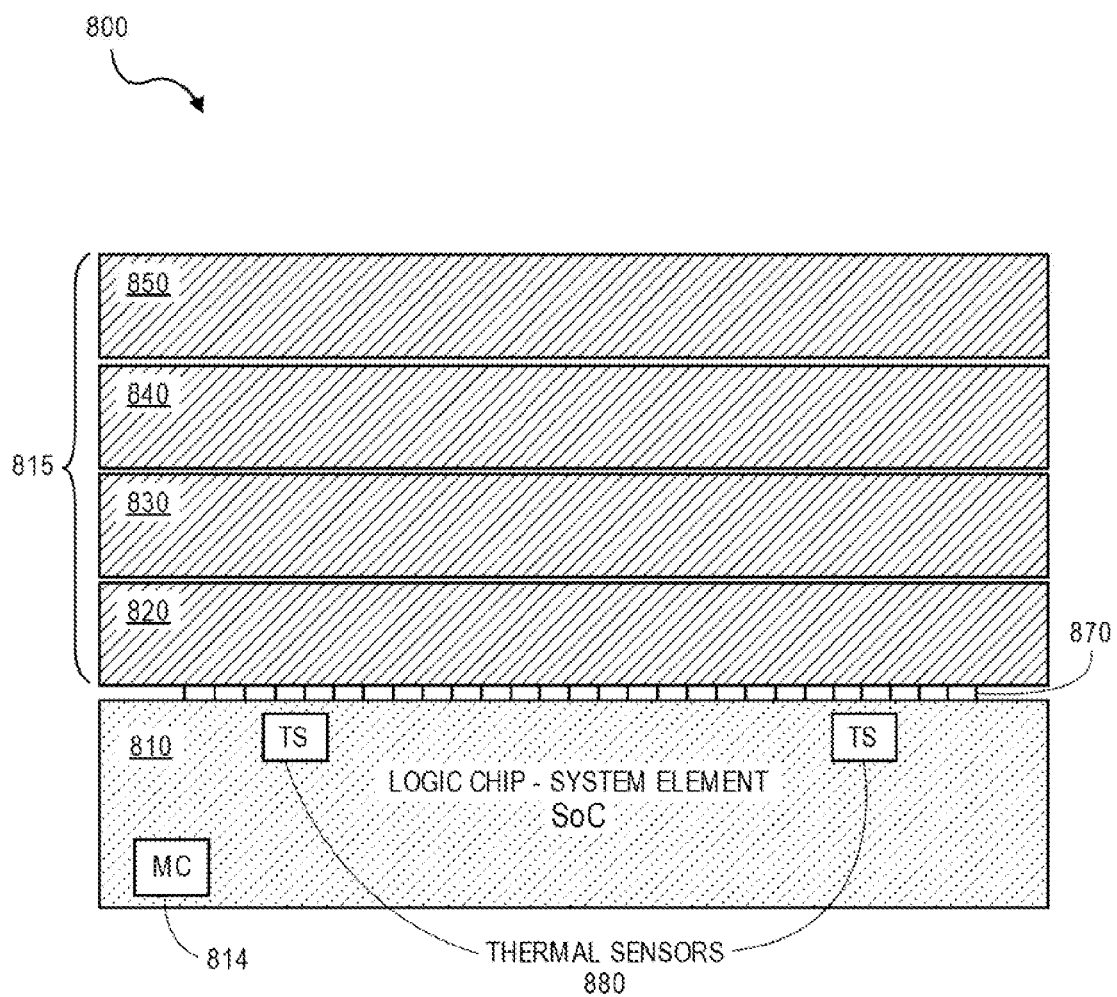
FIGS. 8A and 8B illustrate embodiments of memory devices including includes a thermal subsystem for estimation of thermal conditions in the stacked memory device.
Figure 8B:
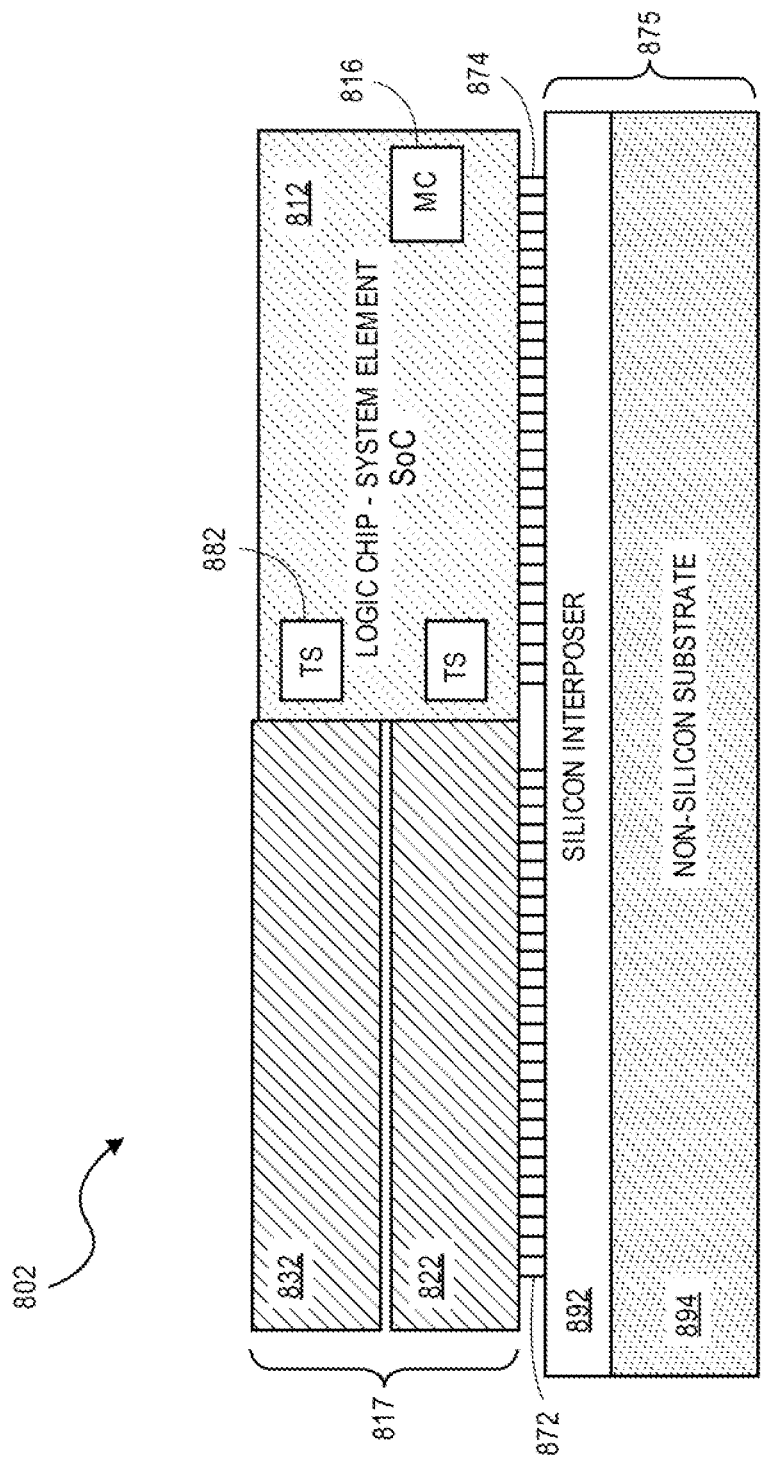

FIGS. 8A and 8B illustrate embodiments of memory devices including includes a thermal subsystem for estimation of thermal conditions in the stacked memory device. In the illustration provided in FIG. 8A, a stacked memory device 800 includes a memory stack 815, where the memory stack in this illustration has four memory die layers, a first memory die layer 820, a second memory die layer 830, a third memory die layer 840, and a fourth memory die layer 850. In this illustration, the memory stack 815 is coupled to a logic chip or other system element 810 by a number of interconnects 870, where the logic chip is thermally coupled with the memory stack. In some embodiments, the logic chip 810 includes a memory controller 814 and one or more thermal sensors 880. In some embodiments, the memory controller 814 estimates thermal conditions in the memory stack 815 using the one or more system thermal sensors 880. In some embodiments, the estimated thermal conditions may be used to establish efficient refresh rates for the memory stack 815, thereby reducing power consumption of the device.

In the illustration provided in FIG. 8B, a stacked memory device 802 includes a memory stack 817 and logic chip 812 or other system element connected via a package substrate 875, where the package substrate may be, for example, a silicon interposer 892 coupled with a non-silicon substrate 894, or may be a silicon substrate (not illustrated here). In this illustration, the memory stack 817 includes two memory die layers, a first memory die layer 822 and a second memory die layer 832, but embodiments are not limited to any particular number of memory die layers. In this illustration, the memory stack 817 and the logic chip 812 are connected with the substrate 875 by interconnects 872 and 874, where the logic chip 812 is thermally coupled with the memory stack. In some embodiments, the logic chip 812 includes a memory controller 816 and one or more thermal sensors 882. In some embodiments, the memory controller 816 estimates thermal conditions in the memory stack 817 using the one or more system thermal sensors 882. In some embodiments, the estimated thermal conditions may be used to establish efficient refresh rates for the memory stack 817.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiment. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
   a memory stack including one or more coupled memory elements; and
   a logic chip coupled with the memory stack, the logic chip including a memory controller and one or more thermal sensors, where the one or more thermal sensors include a first thermal sensor located in a first area of the logic chip;
   wherein the memory controller is to obtain thermal values of the one or more thermal sensors, the logic chip to estimate thermal conditions for the memory stack using the thermal values, the determination of the estimated thermal conditions for the memory stack being based at least in part on a location of the first thermal sensor in the first area of the logic chip; and
   wherein a refresh rate for one or more portions of the memory stack is modified based at least in part on the estimated thermal conditions for the memory stack.

2. The memory device of claim 1, wherein the memory controller is to modify the refresh rate for the one or more portions of the memory stack based at least in part on the estimated thermal conditions for the memory stack.

3. The memory device of claim 2, wherein the memory controller is to modify the refresh rate by instructing a memory element regarding a refresh rate for the memory element.

4. The memory device of claim 2, wherein the memory controller is to modify the refresh rate by running one or more refresh cycles for the memory element at a time when the memory element is not itself running a refresh cycle.

5. The memory device of claim 1, wherein the memory device is to provide data regarding the estimated thermal conditions for the memory stack to a memory element of the memory stack, the memory element to modify the refresh rate for the memory element using the estimated thermal conditions.

6. The memory device of claim 1, wherein the refresh rate is further based on memory performance data for the memory stack.

7. The memory device of claim 1, wherein the logic chip is a system on chip (SoC).

8. The memory device of claim 1, wherein the one or more memory elements are dynamic random-access memory (DRAM) elements.

9. The memory device of claim 1, wherein the one or more memory elements do not include thermal sensors.

10. The memory device of claim 1, wherein the one or more memory elements include thermal sensors that are not accessible to the memory controller.

11. The memory device of claim 1, wherein the one or more memory elements include thermal sensors, and wherein the memory elements use the estimated thermal conditions to tune temperature values generated by the thermal sensors of the memory elements.

12. The memory device of claim 1, wherein the memory elements include one of a plurality of memory die layers or a plurality of memory packages.

13. A method comprising:
    collecting temperature data from one or more thermal sensors in a logic chip, the logic chip being coupled with a memory stack;
    estimating thermal conditions of the memory stack based on the collected temperature data and a location of each of the one or more thermal sensors;
    determining a recommended refresh rate for each of one or more portions of the memory stack; and
    upon determining that a refresh rate of a portion of the memory stack is different than a recommended refresh rate, adjusting the refresh rate for the portion of the memory stack.

14. The method of claim 13, wherein adjusting the refresh rate includes a memory controller of the logic chip to adjust the refresh rate for the one or more portions of the memory stack based at least in part on the estimated thermal conditions for the memory stack.

15. The method of claim 14, wherein the memory controller is to adjust the refresh rate by:
    instructing a memory element regarding a refresh rate for the memory element; or
    running one or more refresh cycles for the memory element at a time when the memory element is not itself running a refresh cycle.

16. The method of claim 13, further comprising providing by the memory device data regarding the estimated thermal conditions to a memory element of the memory stack, wherein adjusting the refresh rate includes the memory element to adjust the refresh rate for the memory element using the estimated thermal conditions.

17. The method of claim 13, wherein the refresh rate is further based on memory performance data for the memory stack.

18. The method of claim 13, wherein the memory elements do not include thermal sensors.

19. The method of claim 13, wherein the memory elements include thermal sensors that are not accessible to a memory controller.

20. The method of claim 13, wherein the one or more memory elements include thermal sensors, and further comprising the memory elements using the estimated thermal conditions to tune temperature values generated by the thermal sensors of the memory elements.

21. A system comprising:
    a processor to process data of the system;
    a transmitter, receiver, or both coupled with an omnidirectional antenna to transmit data, receive data, or both; and
    a memory to store data, the memory including a stacked memory device, the stacked memory device including:
      a memory stack including one or more coupled memory elements; and
      a logic chip coupled with the memory stack, the logic chip including a memory controller and one or more thermal sensors, where the one or more thermal sensors include a first thermal sensor located in a first area of the logic chip;
    wherein the memory controller to obtain thermal values of the one or more thermal sensors, the logic chip to estimate thermal conditions for the memory stack using the thermal values, the determination of the estimated thermal conditions for the memory stack being based at least in part on a location of the first thermal sensor in the first area of the logic chip; and wherein a refresh rate for one or more portions of the memory stack is modified based at least in part on the estimated thermal conditions for the memory stack.

22. The system of claim 21, wherein the memory controller is to modify the refresh rate for the one or more portions of the memory stack based at least in part on the estimated thermal conditions for the memory stack.

23. The system of claim 22, wherein the memory controller is to modify the refresh rate by:
   instructing a memory element regarding a refresh rate for the memory element; or
   running one or more refresh cycles for the memory element at a time when the memory element is not itself running a refresh cycle.

24. The system of claim 21, wherein the memory device is to provide data regarding the estimated thermal conditions for the memory stack to a memory element of the memory stack, the memory element to modify the refresh rate for the memory element using the estimated thermal conditions.

25. A non-transitory computer-readable storage medium having stored thereon data representing sequences of instructions that, when executed by a processor, cause the processor to perform operations comprising:
   collecting temperature data from one or more thermal sensors in a logic chip, the logic chip being coupled with a memory stack;
   estimating thermal conditions of the memory stack based on the collected temperature data and a location of each of the one or more thermal sensors;
   determining a recommended refresh rate for each of one or more portions of the memory stack; and
   upon determining that a refresh rate of a portion of the memory stack is different than a recommended refresh rate, adjusting the refresh rate for the portion of the memory stack.

26. The medium of claim 25, wherein adjusting the refresh rate includes a memory controller of the logic chip to adjust the refresh rate for the one or more portions of the memory stack based at least in part on the estimated thermal conditions for the memory stack.

27. The medium of claim 26, wherein the memory controller is to adjust the refresh rate by:
   instructing a memory element regarding a refresh rate for the memory element; or
   running one or more refresh cycles for the memory element at a time when the memory element is not itself running a refresh cycle.

28. The medium of claim 25, further comprising further comprising instructions that, when executed by the processor, cause the processor to perform operations comprising:
   providing by the memory device data regarding the estimated thermal conditions to a memory element of the memory stack, wherein adjusting the refresh rate includes the memory element to adjust the refresh rate for the memory element using the estimated thermal conditions.

* * * * *